(12) United States Patent
Nozawa et al.

(10) Patent No.: US 7,220,678 B2
(45) Date of Patent: May 22, 2007

(54) METHOD FOR ETCHING OF A SILICON SUBSTRATE AND ETCHING APPARATUS

(75) Inventors: Yoshiyuki Nozawa, Amagasaki (JP); Kazuo Kasai, Amagasaki (JP); Hiroaki Kouno, Amagasaki (JP)

(73) Assignee: Sumitomo Precision Products Co., Ltd., Amagasaki-shi (JP)

( * ) Notice: Subject to any disclaimer, the term of this patent is extended or adjusted under 35 U.S.C. 154(b) by 70 days.

(21) Appl. No.: 10/988,042

(22) Filed: Nov. 12, 2004

(65) Prior Publication Data
US 2005/0130436 A1   Jun. 16, 2005

Related U.S. Application Data

(63) Continuation of application No. PCT/JP04/03693, filed on Mar. 18, 2004.

(30) Foreign Application Priority Data
Mar. 25, 2003   (JP) .............................. 2003-082740

(51) Int. Cl.
  *H01L 21/302* (2006.01)
(52) U.S. Cl. ...................... 438/714; 438/706; 438/710; 216/67
(58) Field of Classification Search ................ 438/706, 438/710, 712, 714, 720; 216/59, 67
See application file for complete search history.

(56) References Cited

U.S. PATENT DOCUMENTS 5,985,761 A * 11/1999 Sparks et al. ................ 438/669

2003/0190814 A1* 10/2003 Kumar et al. ................ 438/711
2003/0211753 A1* 11/2003 Nallan et al. ................ 438/719

FOREIGN PATENT DOCUMENTS

JP           7-503815 A1      4/1995

(Continued)

OTHER PUBLICATIONS

International Search Report in Japanese for PCT/JP2004/003693 mailed Jun. 29, 2004.
Patent Abstracts of Japan for JP2002-323454 published on Nov. 24, 2000.
Patent Abstracts of Japan for JP2000-299310 published on Oct. 24, 2000.

(Continued)

*Primary Examiner*—Lan Vinh
(74) *Attorney, Agent, or Firm*—Judge & Murakami IP

(57) ABSTRACT

A method for etching a silicon substrate is presented in which fast etching speed and etching structures with smooth and perpendicular wall surfaces are achieved. In the etching step, a constant electric power is applied to the silicon substrate to provide a bias potential. Using a mixture of $SF_6$ gas and fluorocarbon gas, there is a step mainly for the progression of dry etching of the etching ground surface. Similarly, using a mixture gas, there is a step mainly for forming a protective layer on the structure surfaces which are perpendicular with respect to the etching ground surface. These two steps are repeated one after the other. In the step for dry etching, the mixture gas is 5–12 volume of fluorocarbon gas with respect to 100 volume $SF_6$ gas. The mixture gas in the protective film formation step is a mixture of 2–5 volume of $SF_6$ gas with respect to 100 volume fluorocarbon gas.

4 Claims, 12 Drawing Sheets

FOREIGN PATENT DOCUMENTS

| | | |
|---|---|---|
| JP | 11-195641 | 7/1999 |
| JP | 2000-299310 | 10/2000 |
| JP | 2000-323454 | 11/2000 |
| WO | WO-03/030239 A1 | 4/2003 |

OTHER PUBLICATIONS

Patent Abstracts of Japan for JP11-195641 published on Jul. 21, 1999.

* cited by examiner

| | | Flow Rate Ratio (B) of C$_4$F$_8$ Gas Flow Rate V$_{d2}$ Over SF$_6$ Gas Flow Rate V$_{e1}$ | | | | | |
|---|---|---|---|---|---|---|---|
| | | 0 | 5 | 7 | 12 | 20 | 30 |
| Flow Rate Ratio(A) of SF$_6$ Gas Flow Rate V$_{e2}$ Over C$_4$F$_8$ Gas Flow Rate V$_{d1}$ | 0 | 4.60 | 4.50 | 4.45 | 4.30 | 4.00 | 3.70 |
| | 2 | 4.80 | 4.70 | 4.65 | 4.55 | 4.10 | 3.60 |
| | 3 | 4.90 | 4.75 | 4.75 | 4.70 | 4.30 | 3.70 |
| | 5 | 5.30 | 4.85 | 4.90 | 4.75 | 4.60 | 4.10 |
| | 10 | 5.80 | 5.50 | 5.30 | 5.00 | 4.70 | 4.30 |

Etching Speed (μm/min)

| | | Flow Rate Ratio (B) of $C_4F_8$ Gas Flow Rate $V_{d2}$ Over $SF_6$ Gas Flow Rate $V_{e1}$ | | | | |
| --- | --- | --- | --- | --- | --- | --- |
| | | 0 | 5 | 7 | 12 | 20 |
| Flow Rate Ratio(A) of $SF_6$ Gas Flow Rate $V_{e2}$ Over $C_4F_8$ Gas Flow Rate $V_{d1}$ | 0 | 2.00 | 1.90 | 1.80 | 1.50 | 1.00 |
| | 2 | 2.20 | 2.20 | 2.10 | 2.00 | 1.20 |
| | 3 | 2.60 | 2.40 | 2.30 | 2.20 | 1.90 |
| | 5 | 2.80 | 2.40 | 2.40 | 2.20 | 1.90 |
| | 10 | 3.70 | 3.00 | 2.90 | 2.60 | 2.10 |

Etching Speed (μm/min)

| | | Flow Rate Ratio (B) of $C_4F_8$ Gas Flow Rate $V_{d2}$ Over $SF_6$ Gas Flow Rate $V_{e1}$ | | | | |
|---|---|---|---|---|---|---|
| | | 0 | 5 | 7 | 12 | 20 |
| Flow Rate Ratio(A) of $SF_6$ Gas Flow Rate $V_{e2}$ Over $C_4F_8$ Gas Flow Rate $V_{d1}$ | 0 | 290 | 220 | 220 | 180 | 100 |
| | 2 | 290 | 260 | 220 | 190 | 180 |
| | 3 | 300 | 260 | 250 | 220 | 180 |
| | 5 | 310 | 260 | 260 | 240 | 190 |
| | 10 | 340 | 300 | 300 | 280 | 200 |

Wall Surface Roughness ρ(nm)

Fig. 12

| | | Flow Rate Ratio(B) of $C_4F_8$ Gas Flow Rate $V_{d2}$ Over $SF_6$ Gas Flow Rate $V_{e1}$ | | | | |
|---|---|---|---|---|---|---|
| | | 0 | 5 | 7 | 12 | 20 |
| Flow Rate Ratio(A) of $SF_6$ Gas Flow Rate $V_{e2}$ Over $C_4F_8$ Gas Flow Rate $V_{d1}$ | 0 | 90.4 | 90.4 | 90.2 | 90.2 | 90.0 |
| | 2 | 90.3 | 90.3 | 90.2 | 90.2 | 90.1 |
| | 3 | 90.4 | 90.4 | 90.3 | 90.2 | 90.1 |
| | 5 | 90.7 | 90.4 | 90.4 | 90.3 | 90.3 |
| | 10 | 91.0 | 90.8 | 90.8 | 90.6 | 90.2 |

Wall Surface Angle $\theta$ (°)

Fig. 14

METHOD FOR ETCHING OF A SILICON SUBSTRATE AND ETCHING APPARATUS

CROSS-REFERENCE TO RELATED APPLICATION

This application is a Continuation of International patent application Serial No. PCT/JP2004/003693 filed Mar. 18, 2004 which was filed in Japanese and claims the benefit of Japanese Patent Application No. 2003-082740 filed Mar. 25, 2003 both of which are incorporated by reference herein in their entireties. The International Application has not been published as of the date of filing of this application.

TECHNICAL FIELD OF THE INVENTION

The present invention relates to a method for etching a silicon substrate and an etching apparatus for forming structural surfaces such as grooves or the like on a silicon substrate by a dry etching process.

BACKGROUND TO THE INVENTION

Structures such as grooves and the like are formed on a silicon substrate by a dry etching process. For example, in the field of semiconductor integrated circuits, there is constant progress towards higher integration and higher density products. An etching technology which can form trenches (deep grooves or deep holes) with high precision is sought. An example of an etching method for this type of trench etching is disclosed in Japanese Laid Open Patent Publication 7-503815.

With this etching method, an etching mask of the desired shape is formed on the silicon substrate surface. Next, there is an etching step for forming grooves or holes in which a mixture gas of $SF_6$ and Ar changed into plasma is used for dry etching of the substrate surface. Similarly, using a mixture gas of $CHF_3$ and Ar changed into plasma, there is a polymerization step (proactive film formation step) which forms a protective film on the side walls of the grooves or holes (henceforth referred to as grooves or the like). By alternately repeating these steps, deep grooves or deep holes (henceforth referred to as deep grooves or the like) are formed.

With this etching method, the wall surfaces of the grooves and the like formed in sequence through dry etching is covered afterwards with a protective film. During subsequent dry etchings, the previous wall surfaces are protected by this protective film. As a result, any extreme side etching or undercutting is prevented, and grooves and the like with wall surfaces which appear to be vertical are formed.

However, with the above etching method, there were the following problems. With the above etching method, there is an etching step which does not include the formation of a protective film on the wall surface, and there is a step for formation of a protective film on the wall surface. These two steps are alternately repeated. As a result, the new wall surfaces formed by etching do not have a protective film. Because of this, in the etching step, the wall surfaces are etched together with the etching ground surface (the bottom surface of the groove or the like). As a result, the wall surfaces have an undulating surface in the vertical direction, and the processing precision is poor. This unevenness of the wall surfaces becomes an obstacle for achieving high integration and high density in the field of semiconductor integrated circuits.

The present inventors have proposed an etching method in Japanese Patent Application Number 2001-299435 in which both the etching step and protective film formation step are implemented using a mixture gas of etching gas and protective film formation gas while having a bias voltage by constantly applying power to the silicon substrate. During the etching step, a mixture gas of a large amount of etching gas and a small amount of protective film formation gas is used. In the protective film formation step, a mixture gas having a small amount of etching gas and a large amount of protective film formation gas is used.

According to this etching method, the etching step and protective film formation step are implemented using a mixture gas of etching gas and protective film formation gas. As a result, in the etching step, the etching ground is etched by the etching gas, and in addition, the vertical structural surfaces formed by etching are immediately coated with a protective film by the protective film formation gas. In the protective film formation step occurring next, the vertical structural surfaces are further firmly covered by a protective film. With this, the etching of the vertical structural surface is suppressed, and the unevenness in its surface is small. Vertical structural surfaces with excellent perpendicularity are formed.

In addition, because power is constantly being applied to provide a bias voltage to the silicon substrate, the etching ground can be physically etched by ion irradiation. In the etching step, the etching speed is increased, and in the protective film formation layer step, the formation of a protective film in the etching ground surface is prevented. As a result, this method has the advantage of being able to shorten the overall etching time.

However with this etching method, as described above, a mixture gas of an etching gas and a protective film formation gas is used for etching. As a result, although the vertical structural surfaces formed by etching are effectively protected, at the etching ground surface, there is the simultaneous progression of opposing actions of etching by the etching gas and ion irradiation and also the formation of a protective film which suppresses etching. Therefore, energy for etching is also spent on removing the protective film. Compared to etching methods which do not use protective film formation gas during etching, the etching speed is reduced with this method.

In addition, with regard to the protective film formation step, the formation of a protective film on the etching ground surface can be suppressed by the etching gas and ions, and the overall etching time can be shortened. However, despite these advantages, because the etching gas also acts on the vertical structural surfaces, these vertical structural surfaces can become etched. In some cases, these surfaces cannot be made adequately smooth.

The present inventors conducted extensive research on the mixture proportions of the mixture gas. This resulted in the discovery of an optimal mixing ratio which increases etching speed and results in the etching formation of vertical structural surfaces with adequate smoothness and excellent perpendicularity as compared to etching methods in which protective film formation gas is not used in the etching progression step and etching gas is not used in the protective film formation step.

SUMMARY OF THE INVENTION

An object of the present invention is to provide an etching method and etching apparatus for a silicon substrate which results in etching formation of vertical structural surfaces which are sufficiently smooth and have excellent perpendicularity without reducing the etching speed.

In order to achieve the above objective, one embodiment of the present invention is a method for etching a silicon substrate, including a step for forming a mask, in which an etching mask is formed on a silicon substrate surface; and a step for etching, in which structural surfaces are formed by dry etching of the silicon substrate from openings in the etching mask using etching gas which has been made into plasma by high frequency power; the mask forming step and the etching step being implemented one after the other to etch the silicon substrate. The etching step, comprises: while providing a bias potential by constantly applying power to the silicon substrate, a step mainly for progression of dry etching of an etching ground by using a mixture gas of $SF_6$ gas as etching gas and a fluorocarbon gas (CxFy) such as $C_4F_8$ and the like as protective film formation gas; a step for mainly forming a protective film on the structure surfaces that are perpendicular with respect to the etching ground surface by similarly using a mixture gas of the $SF_6$ gas and fluorocarbon gas; the dry etching progression step and protective film formation step being repeated one after the other; in the dry etching progression step, the mixture gas is a mixture of 5–12 volume of fluorocarbon gas with respect to 100 volume of $SF_6$ gas; in the protective film formation step, the mixture gas is a mixture of 2–5 volume of $SF_6$ gas with respect to 100 volume of fluorocarbon gas.

According to another embodiment of the invention, in the step where dry etching proceeds, the etching ground surface is etched by $SF_6$ gas and ion irradiation. In addition, the vertical structural surfaces formed by etching are immediately covered by a protective film created by the fluorocarbon gas.

In addition, in the protective film formation step which follows immediately after, the vertical structural surfaces are further securely covered by a protective film. In addition, because of the etching gas and ion irradiation, the formation of a protective film on the etching ground surface is suppressed.

As described above, the mixture gas in the dry etching progression step is a mixture of 5–12 volume fluorocarbon gas with respect to 100 volume of $SF_6$ gas. In other words, $SF_6$ gas and fluorocarbon gas are preferably mixed at a volume ratio of 100:5–12. When the fluorocarbon gas is less than 5, the amount of fluorocarbon is too small, and the vertical structural surfaces formed by etching are not effectively protected. On the other hand, when the amount of fluorocarbon gas exceeds 12, there is too much fluorocarbon gas, and a protective film is likely to be formed on the etching ground surface. A large amount of energy for the etching action is spent on removing the protective film. Compared to etching methods which do not use a protective film formation gas during etching, etching speed is reduced.

In addition, the mixture gas in the protective film formation step has 2–5 volume of $SF_6$ gas mixed with every 100 volume of fluorocarbon gas. In other words, fluorocarbon gas and $SF_6$ gas are preferably mixed at a volume ratio of 100:2–5. When the amount of $SF_6$ gas is less than 2, the amount of $SF_6$ gas is too small, and the formation of a protective film on the etching ground surface is not sufficiently suppressed. As a result, an adequate etching speed is not achieved. On the other hand, when the amount of $SF_6$ gas exceeds 5, there is too much $SF_6$ gas, and the vertical structural surfaces become prone to etching, and the surface precision is inferior.

Thus, according to another embodiment of the invention, a mixture gas of $SF_6$ gas and fluorocarbon gas is used. By having the mixture gas in the dry etching progression step and the mixture gas in the protective film formation step each with the mixing ratios described above, the etching speed is faster and the vertical wall surfaces formed by etching are smoother with higher surface precision as compared with etching methods that do not use protective film formation gas in the dry etching progression step and that do not use etching gas in the protective film formation step.

In addition, the power applied to the silicon substrate is preferably high during the dry etching progression step and low during the protective film formation step. By doing so, the ion irradiation speed during the dry etching progression step is increased, and the etching speed is increased. During the protective film formation step, the removal by irradiation ions of the protective film formed on the vertical structural surfaces is minimized, and the vertical structural surfaces are more effectively protected.

Furthermore, with regard to the high frequency power for generating plasma, this is preferably high during the dry etching progression step and low during the protective film formation step. By doing so, during the dry etching progression step, $SF_6$ gas efficiently becomes plasma, and etching speed increases. On the other hand, during the protective film formation step, the proportion of $SF_6$ gas becoming plasma is reduced, and the vertical structural surfaces are less easily etched, and the vertical structural surfaces are more effectively protected.

In addition, the above etching method can be started with the dry etching progression step or started with the protective film formation step. However, starting with the protective film formation step is preferable because the roughness in the vertical structural surfaces is less.

The etching method described above is ideally implemented with the following exemplary etching device.

An embodiment of the present invention is an apparatus for etching a substrate, including an etching chamber for housing an etching target of a silicon substrate; a stage on which the silicon substrate is placed and which is placed in a lower part inside the etching chamber; a means for supplying etching gas which supplies $SF_6$ gas as etching gas into the etching chamber; a means for supplying protective film formation gas which supplies fluorocarbon gas as protective film formation gas into the etching chamber; a means for reducing pressure which reduces pressure inside the etching chamber; a means for generating plasma, which is equipped with a coil placed opposite the outer perimeter of the etching chamber and which applies high frequency power to the coil and which makes plasma from the $SF_6$ gas and fluorocarbon gas supplied into the etching chamber; a means for applying power to the stage which applies high frequency power to the stage; a means for controlling gas flow rate which controls flow rate of the $SF_6$ gas and fluorocarbon gas which are supplied to the etching chamber by the etching gas supply means and the protective film formation gas supply means; a means for controlling coil power which controls the power applied to the coil of the plasma generating means; a means for controlling stage power which controls the power applied to the stage by the stage power applying means; the gas flow rate control means being constructed so that the $SF_6$ gas and fluorocarbon gas are continuously supplied into the etching chamber at supply amounts that change periodically, and the supply amounts of both gases are in opposite phases, and during times of large $SF_6$ gas supply, fluorocarbon gas is supplied at 5–12 volume with respect to 100 volume of $SF_6$ gas, and during times of large fluorocarbon gas supply, $SF_6$ gas is supplied at 2–5 volume with respect to 100 volume of fluorocarbon gas.

The stage power control means is preferably constructed so that a large amount of power is applied to the stage during times of large $SF_6$ gas supply and a low amount of power is applied to the stage during times of large fluorocarbon gas supply.

The coil power control means is similarly preferably constructed so that a large amount of power is applied to the coil during times of large $SF_6$ gas supply and a low amount of power is applied to the coil during times of large fluorocarbon gas supply.

BRIEF DESCRIPTION OF THE FIGURES

FIG. 12 is a table showing the measurement results for surface precision $\rho$ in Experiment 2;

FIG. 14 is a table showing the measurement results for angle $\theta$ in Experiment 2.

DESCRIPTION OF THE PREFERRED EMBODIMENTS

Referring to the attached drawings, embodiments of the present invention will be described in further detail.

Figure 1:
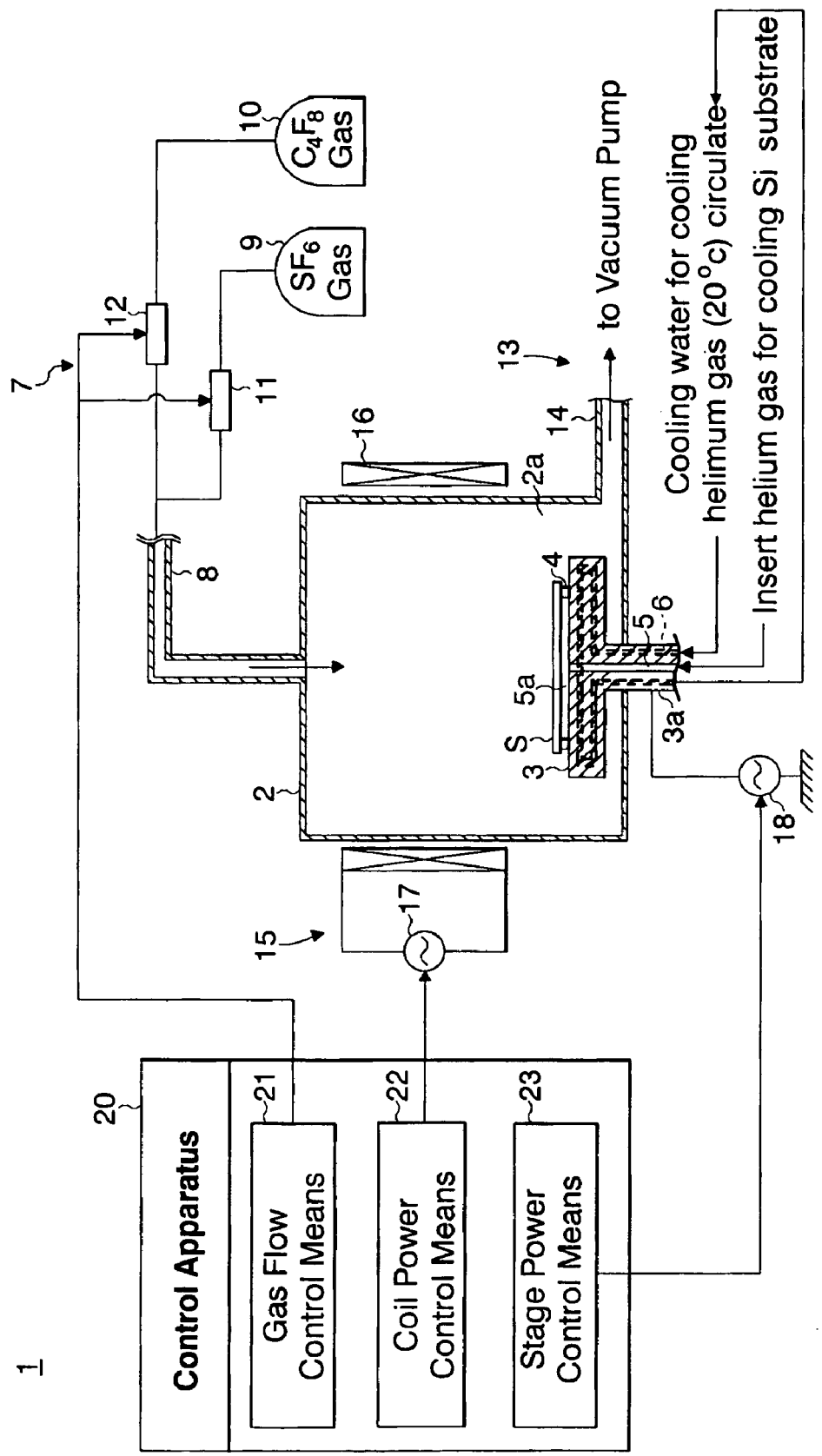
FIG. 1 is a cross-section showing a portion of the schematic construction of an etching device according to an embodiment of the invention as a block diagram.

Referring to FIG. 1, the construction of the etching apparatus of the present embodiment will be described. FIG. 1 is a cross-section showing a schematic construction of the etching apparatus of the present embodiment as a partial block diagram.

As shown in FIG. 1, an etching apparatus 1 comprises: a case-like etching chamber 2 made of ceramic and which has an etching room 2a inside; a stage 3 which is situated in the lower region inside etching room 2a and onto which a silicon substrate S which is the etching target is placed; a gas supplier 7 which supplies etching gas of $SF_6$ gas and a protective film formation gas of fluorocarbon gas ($C_xF_y$) such as $C_4F_6$ into the inside of etching room 2a; a pressure reducer 13 which reduces pressure inside etching room 2a; a plasma generator 15 which makes the $SF_6$ gas and fluorocarbon gas supplied to etching room 2a into plasma; a high frequency power source 18 which applies high frequency electric power to stage 3; and a control apparatus 20 which controls the operation of each of these parts.

Silicon substrate S is placed on top of stage 3 via a sealing member such as an O ring 4 or the like. Stage 3 is installed so that its base piece 3a leads to the outside of etching room 2a. At its center, there is a connecting passage 5 which connects to a space 5a which is formed between stage 3 and silicon substrate S. Through connecting passage 5, space 5a is filled with helium gas and sealed. In addition, a cooling water circulating path 6 is formed on stage 3. By having cooling water (20 degrees C.) circulate inside cooling water circulation path 6, silicon substrate S is cooled via stage 3 and the helium gas. In addition, a high frequency electrical power of 13.56 MHz is applied to stage 3 by high frequency power source 18, and a bias voltage is generated in stage 3 and silicon substrate S which is placed on stage 3.

Gas supplier 7 comprises: a gas supply pipe 8 which is connected to the upper end of etching chamber 2; and compressed gas cylinders 9 and 10 which are connected to gas supply pipe 8 via mass flow controllers 11, 12, respectively. Gas whose flow is adjusted by mass flow controllers 11, 12 is supplied from compressed gas cylinders 9, 10 to the inside of etching room 2a. In the present example, compressed gas cylinder 9 is filled with $SF_6$ gas for etching, and compressed gas cylinder 10 is filled with $C_4F_6$ gas for forming a protective film.

Pressure reducer 13 comprises an exhaust pipe 14 which is connected to the lower end of etching chamber 2, and a vacuum pump (not shown) connected to exhaust pipe 14. The inside of etching room 2a is maintained at a specified reduced pressure by the vacuum pump (not shown)

Plasma generator 15 comprises a coil 16 which is placed along the outer perimeter of etching chamber 2 at a position higher than stage 3, and a high frequency power source 17 which applies high frequency electric power of 13.56 MHz to coil 16. By applying high frequency electric power to coil 16, a fluctuating magnetic field is formed in the space inside etching room 2a. The gas supplied into etching room 2a is made into plasma by the electric field which is induced by the fluctuating magnetic field.

Control device 20 comprises: a gas flow control means 21, which controls mass flow controllers 11, 12 and which adjusts the gas flow supplied to the inside of etching room 2a from compressed gas cylinders 9, 10; a coil power control means 22 which controls the high frequency power applied to coil 16; and a stage power control means 23 which controls the high frequency power applied to stage 3.

Next, a description of the etching process of silicon substrate S by etching apparatus 1 with the above construction will be given.

First, using photolithography or the like, an etching mask (a resist film or $SiO_2$ film or the like) of the desired shape is formed on top of silicon substrate S. Next, silicon substrate S is transported to inside etching chamber 2 and is placed on top of stage 3 via O ring 4. The inside of space 5a is then filled with helium gas from connecting passage 5, and this is sealed. Cooling water is constantly being circulated inside cooling water circulation path 6.

Next, $SF_6$ gas and $C_4F_6$ gas are supplied to inside etching room 2a from compressed gas cylinders 9 and 10, respectively. In addition, high frequency power is applied to coil 16, and high frequency power is applied to stage 3.

Figure 2A:
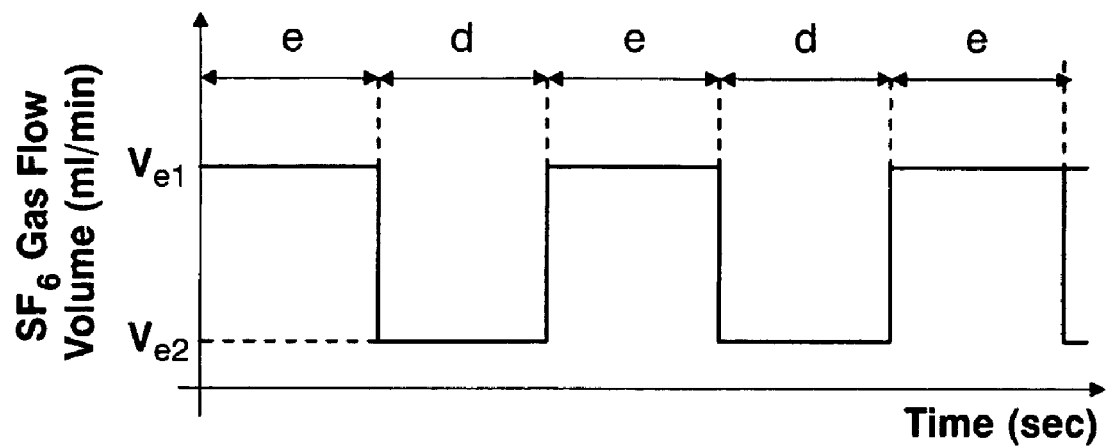
FIGS. 2(a), 2(b), 2(c) and 2(d) illustrate timing charts showing the control status for the flow of $SF_6$ gas and $C_4F_8$ gas as well as for the high frequency power applied to the coil and the stage.
Figure 2B:
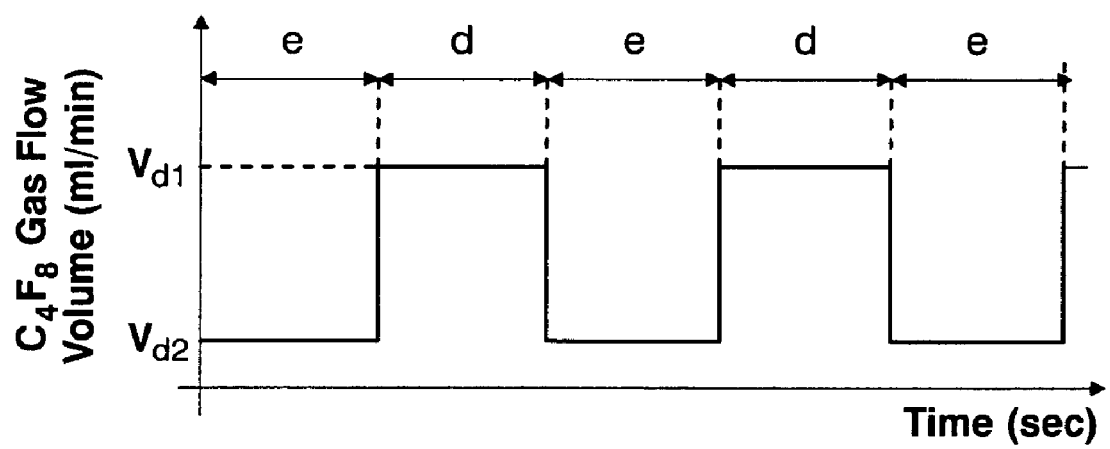

Referring to FIG. 2(a), the flow rate of $SF_6$ gas supplied to inside etching room 2a changes in a rectangular waveform within the range of $V_{e2}$ to $V_{e1}$. Referring to FIG. 2(b), the flow rate of $C_4F_8$ gas changes in a rectangular waveform within the range of $V_{d2}$ to $V_{d1}$. In addition, the phase of $SF_6$ gas and the phase of $C_4F_8$ gas are each controlled by gas flow control means 21 so that they are opposite of each other.

Flow rate $V_{e1}$ for $SF_6$ gas and flow rate $V_{d2}$ for $C_4F_8$ gas are controlled by gas flow control means 21 so that the gas flow ratio (in other words the mixing volume ratio) $V_{e1}:V_{d2}$ is in the range of 100:5–12. In addition, flow rate $V_{e2}$ for $SF_6$ gas and flow rate $V_{d1}$, for $C_4F_8$ gas are controlled by gas flow control means 21 so that the gas flow ratio (in other words the mixing volume ratio) $V_{e2}:V_{d1}$ is in the range of 2–5:100.

Figure 2C:
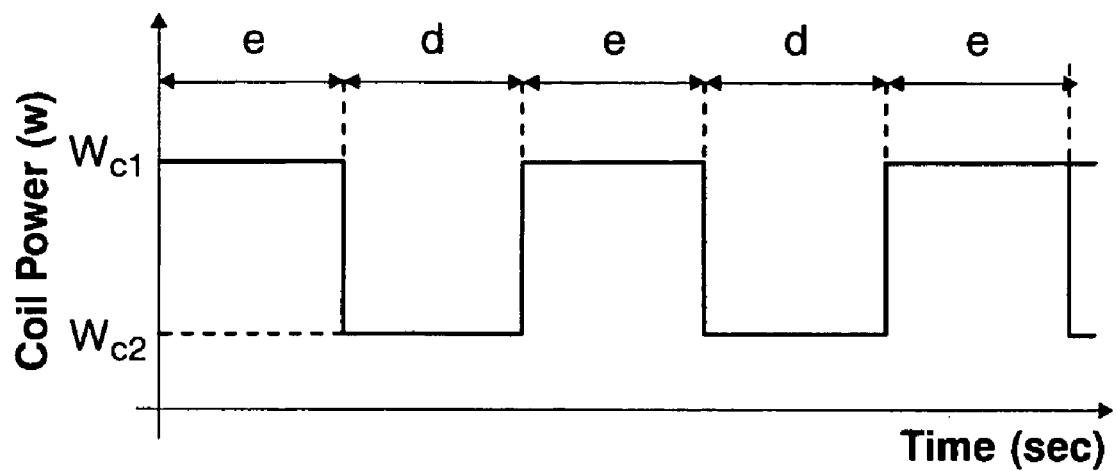
Figure 2D:
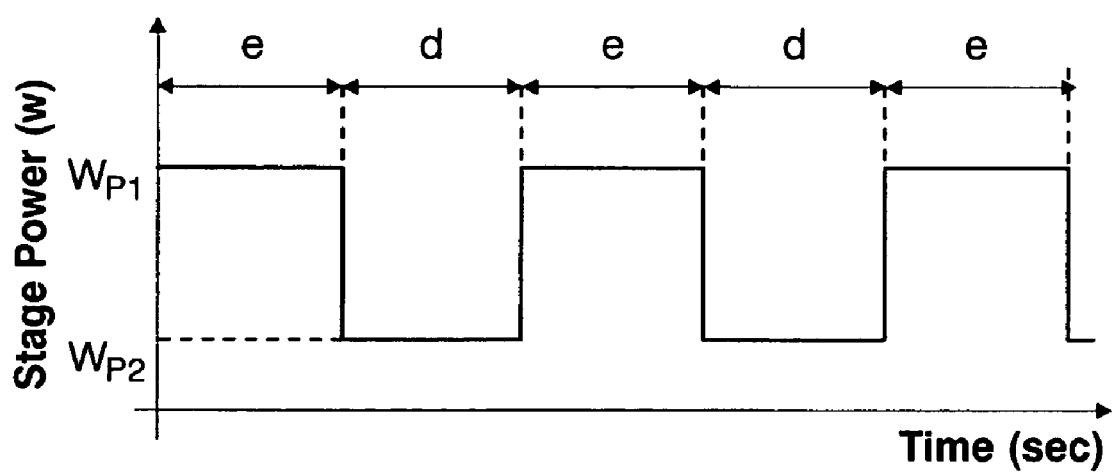

In addition, referring to FIG. 2(c), the high frequency power applied to coil 16 changes in a rectangular waveform within the range of $W_{o2}$ to $W_{o1}$. Referring to FIG. 2(d), the high frequency power applied to stage 3 changes in a rectangular waveform within the range of Wp2 to Wp1. In addition, the phase of high frequency power applied to coil 16 and the phase of the high frequency power applied to stage 3 are controlled by coil power control means 22 and stage power control means 23 so that they are in the same phase with each other.

In the fluctuating magnetic field generated by coil 16, the $SF_6$ gas and $C_4F_8$ gas supplied to inside etching room 2a becomes plasma containing ions, electrons, F radicals, and the like. The plasma is maintained at a high density by the action of the fluctuating magnetic field. F radicals present in the plasma chemically react with Si, and removes Si from silicon substrate S. In other words, it has the action of etching silicon substrate S. Due to the self bias potential generated in stage 3 and silicon substrate S, ions accelerate towards stage 3 and silicon substrate S, and collide with silicon substrate S, and etch substrate S. Thus, as a result of these F radicals and ions, the mask openings of the surface (etching ground surface) of silicon substrate S are etched, and grooves or the like with the desired width and depth are formed.

By becoming plasma, $C_4F_8$ gas becomes a polymer and accumulates and forms a fluorocarbon film on the wall surfaces and the bottom surface (etching ground surface) of the groove or the like. This fluorocarbon film does not react with F radicals and acts as a protective film against F radicals. Side etching and undercutting are prevented by this protective film.

In this manner, in the presence of the plasma which results from supplying $SF_6$ gas and $C_4F_8$ gas simultaneously into etching room 2a, the two opposing actions of etching by F radicals and ion irradiation and the formation of a protective film by polymerization proceeds simultaneously in the wall surfaces and bottom surface of the groove or the like. With a more detailed look, the bottom surface (etching ground surface), which has a large amount of ion irradiation, has more polymer removal action due to the ion irradiation than polymer accumulation. Etching by F radicals and ions proceeds more readily. On the other hand, with wall surfaces, there is less ion irradiation, and there is a greater action of polymer accumulation than the removal of polymer by ion irradiation. The formation of the protective film occurs more readily.

Given the above, for the present embodiment, the flow rate of $SF_6$ gas and $C_4F_8$ gas, the high frequency power applied to coil 16, and the high frequency power applied to stage 3 are each controlled as described above and as shown in FIG. 2.

Stated more concretely, referring to FIG. 2, in the time period indicated by e, the supply amount $V_{e1}$ of $SF_6$ gas is large, and the supply amount $V_{d2}$ of $C_4F_8$ gas is low. In addition, the amount $W_{o1}$ of high frequency power applied to coil 16 is high, and the amount $W_{p1}$ of high frequency power applied to stage 3 is high. By having the supply amount of $SF_6$ gas high, and supply amount of $C_4F_8$ gas low, and having a large amount of high frequency power applied to coil 16, there is a suitable amount of generation of F radicals and ions needed for etching. Polymer generation is kept at a minimum amount that will prevent side etching and undercutting. In addition, by having a large amount of high frequency power applied to stage 3, ion irradiation speed is increased, and etching speed is increased.

With the above, at the etching ground (bottom surface) where there is a large amount of ion irradiation, removal of polymer by ion irradiation occurs much more than accumulation of polymer, and etching by F radicals and ions proceeds. On the other hand, with wall surfaces which have little ion irradiation, there is much more polymer accumulation as compared to polymer removal by ion irradiation, and formation of a protective film proceeds. The wall surfaces which are formed by etching are immediately covered by this protective film.

With regard to the time period indicated by d in FIG. 2, the supply amount $V_{e2}$ of $SF_6$ gas is low, and the supply amount $V_{d1}$ of $C_4F_8$ gas is high. In addition, the amount $W_{o2}$ of high frequency power applied to coil 16 is low, and the amount $W_{p2}$ of high frequency power applied to stage 3 is low. By having a low supply of $SF_6$ gas and a large supply of $C_4F_8$ gas, more polymer which is needed for protective film formation is generated. On the other hand, the generation of F radicals and ions can be kept at the minimum amount necessary for removing polymer accumulated on the etching ground. Furthermore, by having a low amount of high frequency power applied to stage 3, the ion irradiation speed can be slowed to a degree necessary for removing polymer accumulating on the etching ground, and the removal by ion irradiation of the protective film accumulating on the wall surfaces is prevented.

With the above, with regard to the etching ground (bottom surface), etching is suppressed to a degree that allows for removal of accumulated polymer by ion irradiation. With the wall surfaces which has little ion irradiation, a larger amount of polymer accumulates, and a strong protective film is formed.

Thus, by repeated implementation of step e and step d, the step mainly for etching and the step mainly for protective film formation are alternately repeated. The wall surfaces created by etching are immediately covered by a protective film. In addition, in the next step, an even stronger protective film is formed. As a result, the side etching and undercutting described above is reliably prevented. As a result, trenches having inner wall surfaces which are vertical and which have a roughness that is below a specified standard are efficiently formed on silicon substrate S.

For this effect, flow rate $V_{e1}$ for $SF_6$ gas is preferably in the range of 60 to 600 ml/min. Flow rate $V_{d1}$ for $C_4F_8$ gas is preferably in the range of 50 to 400 ml/min.

In addition, as described above, flow rate $V_{d2}$ for $C_4F_8$ gas preferably has a ratio with flow rate $V_{e1}$ for $SF_6$ gas of $V_{d2}:V_{e1}$ in the range of 5–12:100. When $V_{d2}$ is less than 5, the amount of $C_4F_8$ gas is too small, and the wall surfaces formed by etching are not effectively protected. On the other hand, when $V_{d2}$ exceeds 12, the amount of $C_4F_8$ gas is too large, and a protective film forms readily on the etching ground, and a large amount of energy for the etching action is spent on removing the protective film, resulting in a reduced etching speed.

In addition, the flow rate $V_{e2}$ for $SF_6$ gas preferably has a ratio with flow rate $V_{d1}$ for $C_4F_8$ gas of $V_{e2}:V_{d1}$ in the range of 2–5:100. When $V_{e2}$ is less than 2, the amount of $SF_6$ gas is too small, and protective film formation on the etching ground is not adequately suppressed, resulting in inadequate etching speeds. On the other hand, when $V_{e2}$ exceeds 5, the amount of $SF_6$ gas is too large, and the wall surfaces are more readily etched, resulting in poor surface precision.

In addition, the high frequency power $W_{o1}$ applied to coil 16 is preferably in the range of 800 to 3000 W, and $W_{o2}$ is preferably in the range of 600 to 2500 W. Furthermore, high frequency power $W_{p1}$ applied to stage 3 is preferably in the range of 3 to 50 W (more preferably 10 to 50 W), and $W_{p2}$ is preferably in the range of 2 to 25 W (more preferably 5 to 25 W).

In addition, the implementation time of step e is preferably in the range of 3 to 45 seconds. For step d, the implementation time is preferably in the range of 3 to 30 seconds.

In this manner, with the present example, a mixture gas of $SF_6$ gas and $C_4F_8$ gas (fluorocarbon gas) is used. By having the mixture gas in the etching progression step and the mixture gas in the protective film formation step each with the mixing ratios described above, the etching speed is faster and the wall surfaces formed by etching are smoother with higher surface precision as compared with etching methods that do not use protective film formation gas in the etching progression step and that do not use etching gas in the protective film formation step.

By conducting etching with this degree of high precision, improved integration and increased density can be achieved with semiconductor integrated circuits. In addition, micromachines with high shape precision can be manufactured.

Based on the following experiments, the concrete effects of the present invention will be described.

1. Experiment 1

Figure 3:
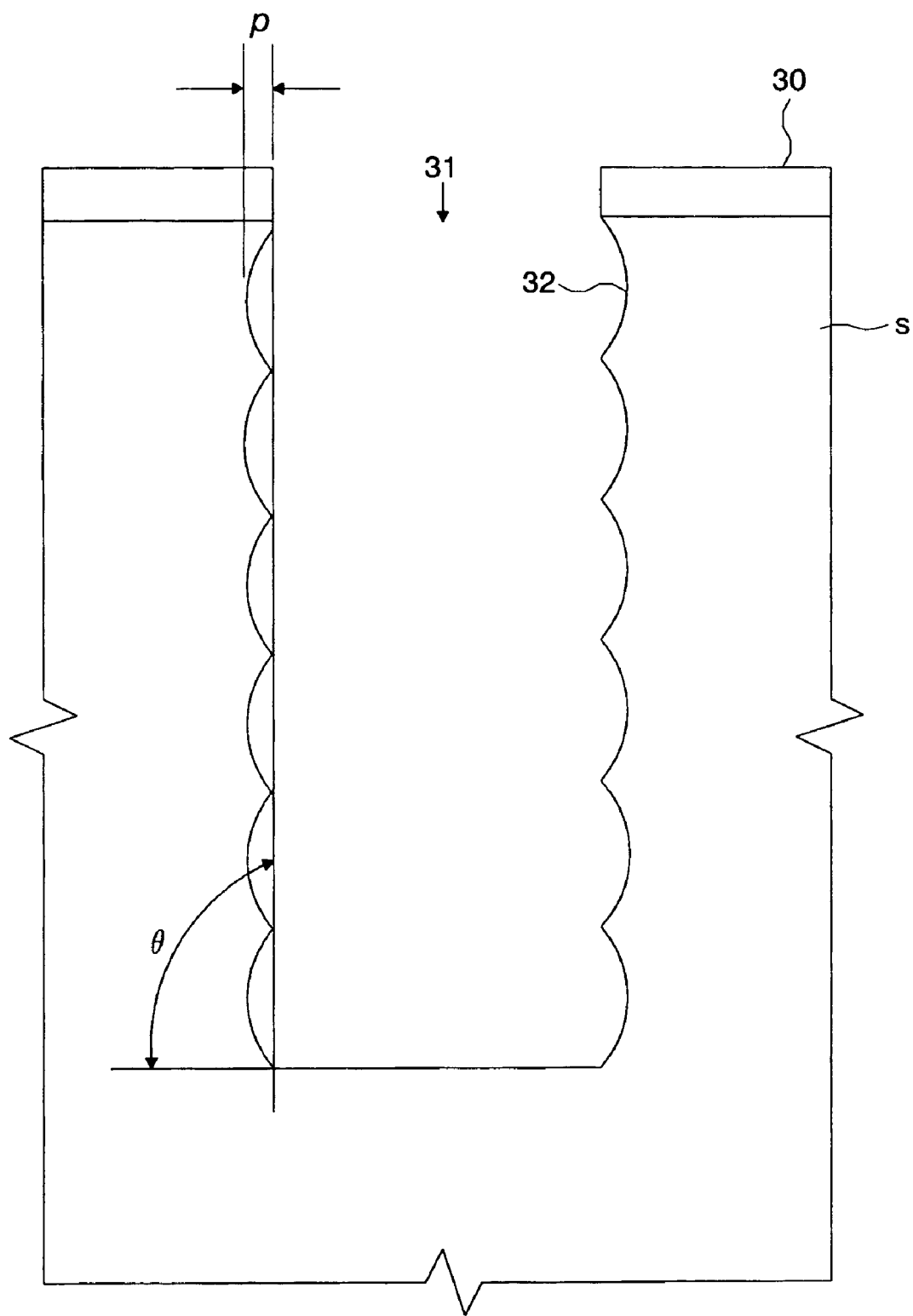
FIG. 3 is a descriptive drawing for describing an evaluation method for the experiments.

For the etching gas, $SF_6$ gas was used, and for the protective film formation gas, $C_4F_8$ gas was used. For the high frequency power applied to coil 16, $W_{o1}$ was 2200 W, and $W_{o2}$ was 1500 W. For the high frequency power applied to stage 3, $W_{p1}$ was 40 W, $W_{p2}$ was 20 W. Flow rate $V_{e1}$ of $SF_6$ gas during step e was 450 ml/min, and flow rate $V_{d1}$ of $C_4F_8$ gas during step d was 150 ml/min. During step d, flow rate $V_{e2}$ for $SF_6$ gas changed to 0 ml/min, 3 ml/min, 4.5 ml/min, 7.5 ml/min, 15 ml/min. Furthermore, during step e, flow rate $V_{d2}$ of $C_4F_8$ gas changed to 0 ml/min, 22.5 ml/min, 31.5 ml/min, 54 ml/min, 90 ml/min, 135 ml/min. The silicon substrate was etched under these conditions, and a hole 31 as shown in FIG. 3 was formed on the silicon substrate.

The processing time for step e was 8.5 seconds and the processing time for step d was 3 seconds. Steps e and d were implemented repeatedly for 15 minutes. In addition, the pressure inside etching chamber 2 was 4.0 Pa in step e and 1.9 Pa in step d.

Figures 4, 5:
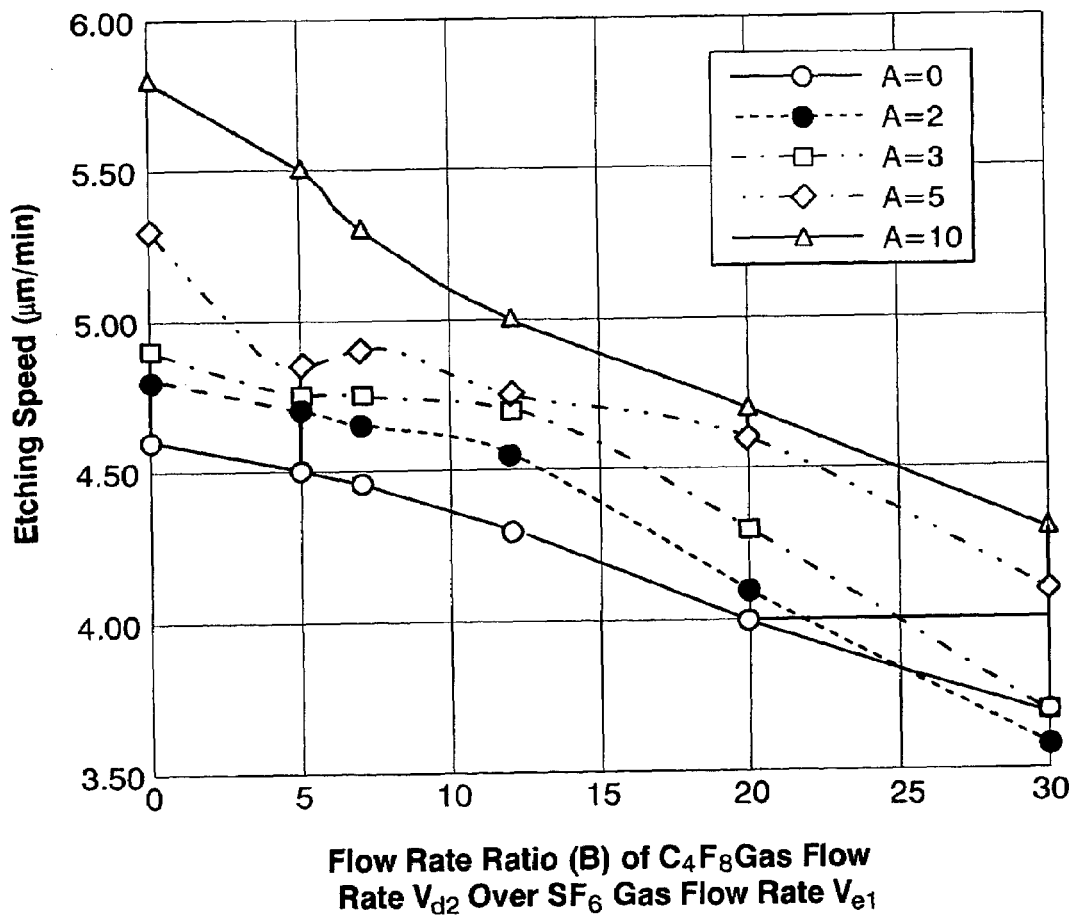
FIG. 4 is a table showing the measurement results for etching speeds for Experiment 1.
FIG. 5 is a graph showing the measurement results for etching speeds in Experiment 1.
Figure 6:
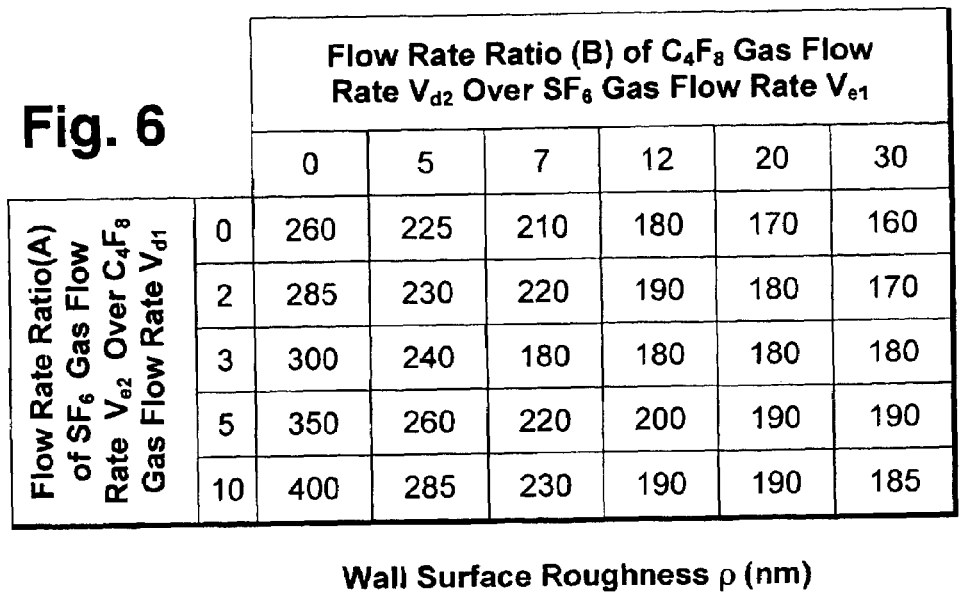
FIG. 6 is a table showing the measurement results for surface precision $\rho$ in Experiment 1.
Figure 7:
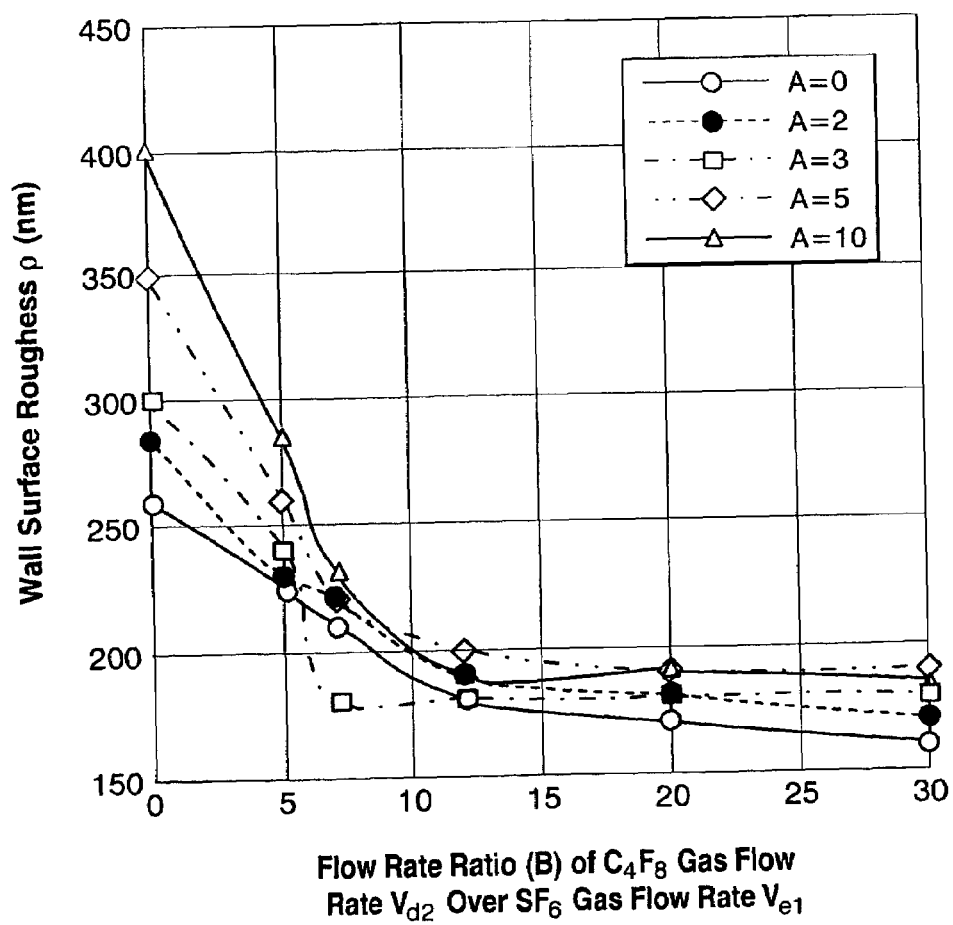
FIG. 7 is a graph showing the measurement results for surface precision $\rho$ in Experiment 1.
Figures 8, 9:
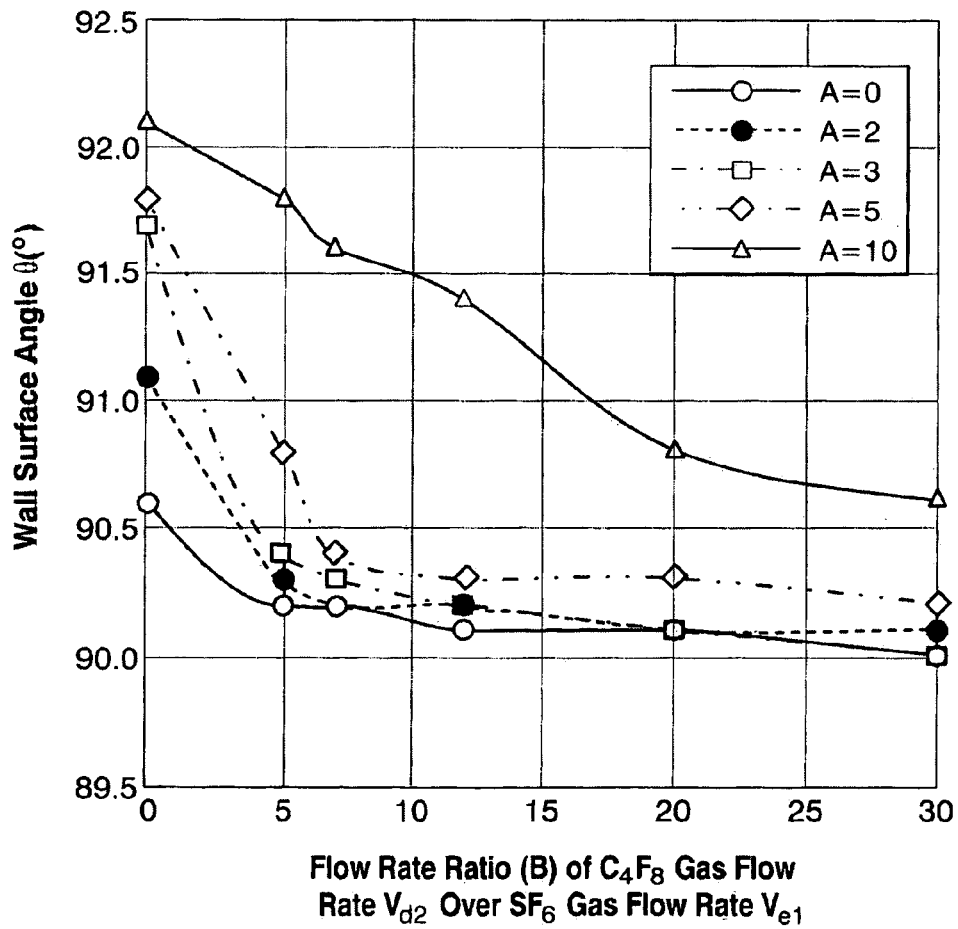
FIG. 8 is a table showing the measurement results for angle $\theta$ in Experiment 1.
FIG. 9 is a graph showing the measurement results for angle $\theta$ in Experiment 1.

With the etching conditions described above, the etching speed, surface precision (roughness) ρ (nm) of hole wall surface 32, and angle θ (degrees) of wall surface 32 with respect to the groove bottom surface were measured. The results are shown in FIGS. 4 through 9. FIG. 4 is a table showing the measurement results for the etching speed (micrometers/min) under the etching conditions described above. FIG. 5 is a graph of the same. FIG. 6 is a table showing the measurement results for the surface precision (roughness) ρ (nm). FIG. 7 is a graph of the same. In addition, FIG. 8 is a table showing the measurement results for angle θ (degrees). FIG. 9 is a graph of the same.

In addition, in FIGS. 4, 6, and 8, flow rate $V_{e2}$ for $SF_6$ gas is expressed as a flow rate ratio with $C_4F_8$ gas flow rate $V_{d1}$ (150 ml/min) as 100. Similarly, flow rate $V_{d2}$ of $C_4F_8$ gas is expressed as a flow rate ratio with $SF_6$ gas flow rate $V_{e1}$ (450 ml/min) as 100.

Referring to FIGS. 4 through 9, when $SF_6$ gas was not used in step d (when A=0), the greater the flow rate $V_{d2}$ for $C_4F_8$ gas in step e, the better the surface precision (roughness) ρ (nm) and angle θ (degrees). However, etching speed was reduced. In addition, when $C_4F_8$ gas was not used in step e, increasing $SF_6$ gas flow rate $V_{e2}$ increased the etching speed. However, surface precision (roughness) ρ (nm) and angle θ (degrees) became poor.

From these results, it can be predicted that the right amounts for $SF_6$ gas flow rate $V_{e2}$ in step d and $C_4F_8$ flow rate $V_{d2}$ for step e could achieve good etching speed, surface precision (roughness) ρ (nm) and angle θ (degrees). In the present experiment, as shown in FIGS. 4 through 9, when the flow rate ratio of $SF_6$ gas flow rate $V_{e2}$ with respect to $C_4F_8$ gas flow rate $V_{d1}$ was in the range of 2–5 and the flow rate ratio of $C_4F_8$ flow rate $V_{d2}$ with respect to $SF_6$ gas flow rate $V_{e1}$ was 5–12, the etching speed was fast with good surface precision (roughness) ρ (nm) and angle θ (degrees) as compared with when $C_4F_8$ gas was not used in step e and $SF_6$ gas was not used in step d (in other words when A=0 and B=0).

Faster etching speeds are preferred, however, in the present example, an etching speed that is of the same level as or better than the etching speed when $C_4F_8$ gas is not used in step e and $SF_6$ gas is not used in step d (when A=0 and B=0) as described above is deemed to be preferable. In addition, with regard to surface precision (roughness) ρ (nm), smaller is preferred. However, a surface precision that is of the same level as or better than the surface precision when $C_4F_8$ gas is not used in step e and $SF_6$ gas is not used in step d (when A=0 and B=0) is deemed to be good. Furthermore, angle θ (degrees) is preferably as close to 90 degrees as possible, but an angle of 91 degrees or less is deemed to be good.

2. Experiment 2

$SF_6$ gas was used again as etching gas, and $C_4F_8$ gas was used as protective film formation gas. For the high frequency power applied to coil 16, $W_{o1}$ was 900 W and $W_{o2}$ was 800 W. For the high frequency power applied to stage 3, $W_{p1}$ was 25 W and $W_{p2}$ was 5 W. Flow rate $V_{e1}$ of $SF_6$ gas during step e was 200 ml/min, and flow rate $V_{d1}$ of $C_4F_8$ gas during step d was 60 ml/min. During step d, flow rate $V_{e2}$ for $SF_6$ gas changed to 0 ml/min, 1.2 ml/min, 1.8 ml/min, 3 ml/min, 6 ml/min. Furthermore, during step e, flow rate $V_{d2}$ of $C_4F_8$ gas changed to 0 ml/min, 10 ml/min, 14 ml/min, 24 ml/min, 40 ml/min. The silicon substrate was etched under these conditions, and a hole 31 as shown in FIG. 3 was formed on the silicon substrate.

The processing time for step e was 15 seconds and the processing time for step d was 7 seconds. Steps e and d were implemented repeatedly for 30 minutes. In addition, the pressure inside etching chamber 2 was 2.5 Pa in step e and 0.8 Pa in step d.

Figures 10, 11:
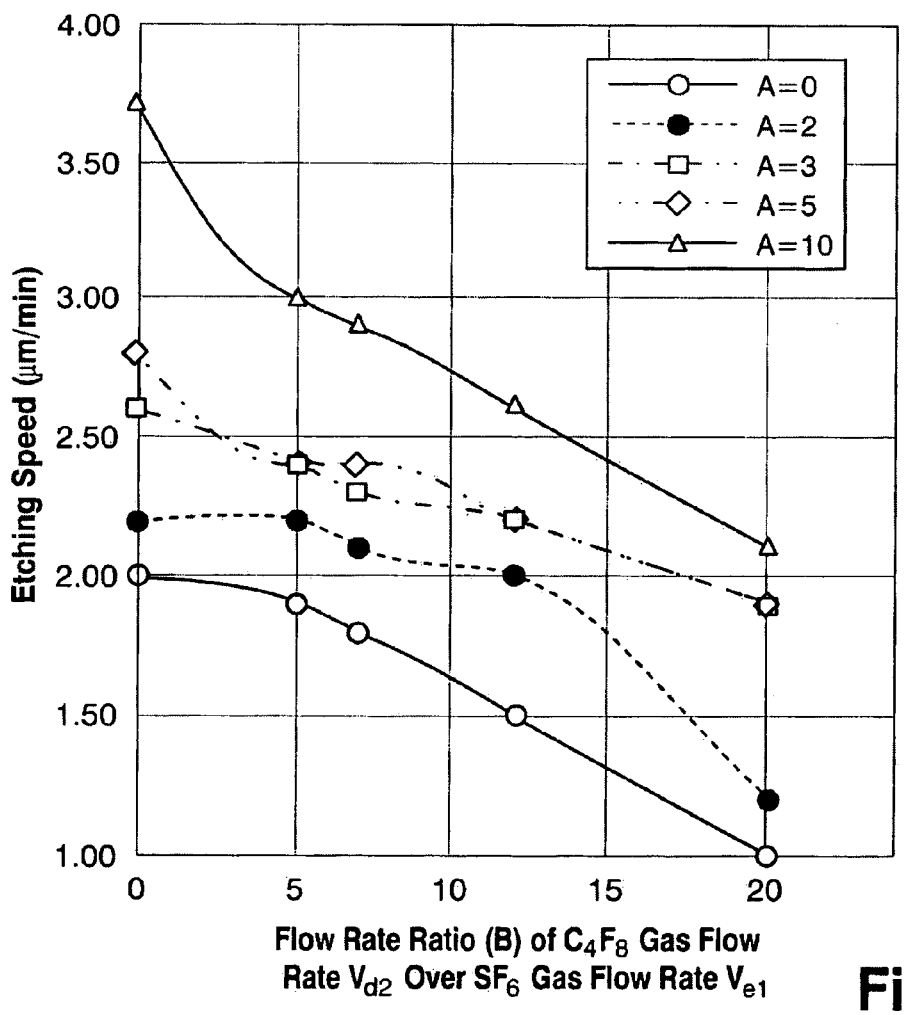
FIG. 10 is a table showing the measurement results for etching speed in Experiment 2.
FIG. 11 is a graph showing the measurement results for etching speed in Experiment 2.
Figure 13:
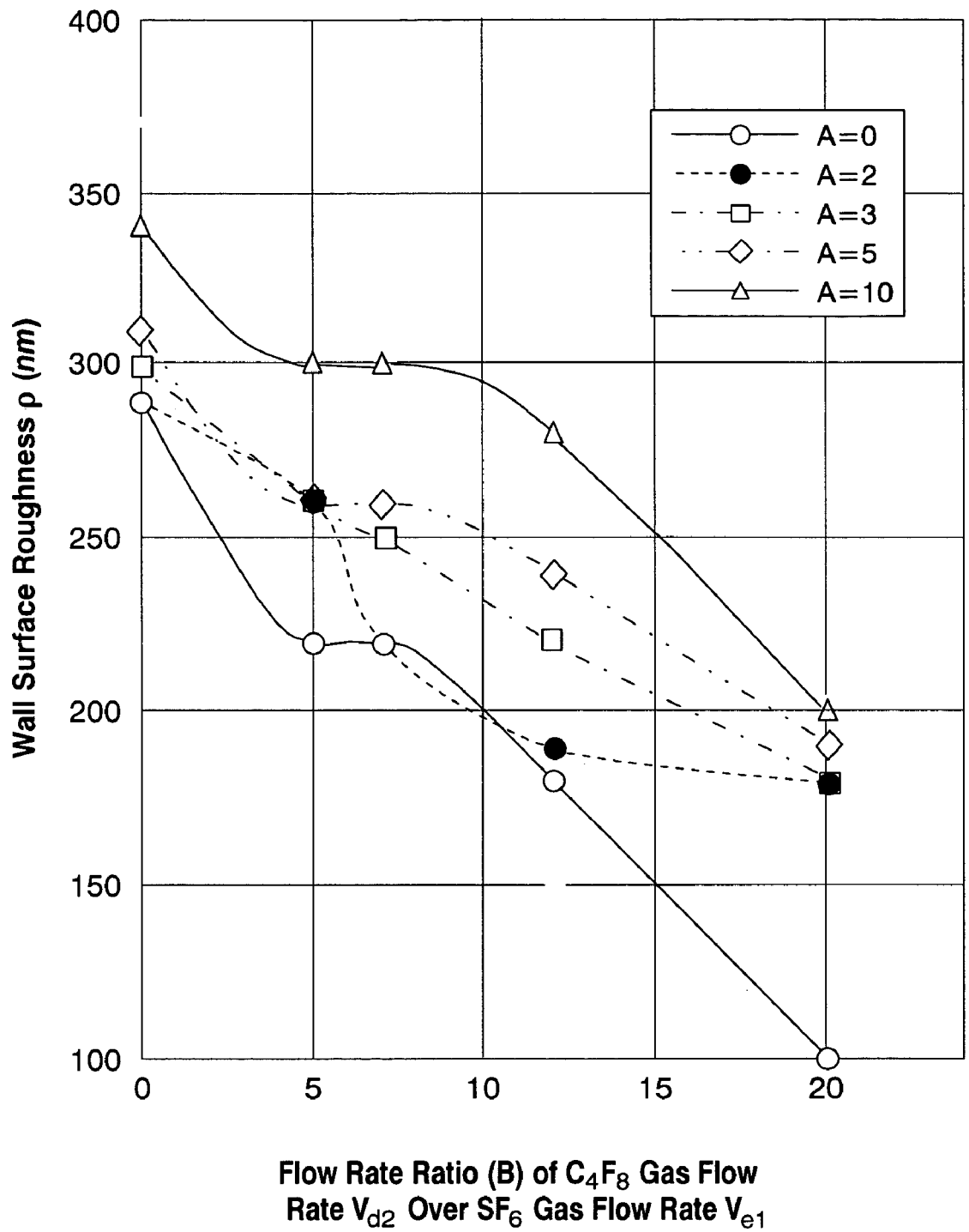
FIG. 13 is a graph showing the measurements results for surface precision $\rho$ in Experiment 2.
Figure 15:
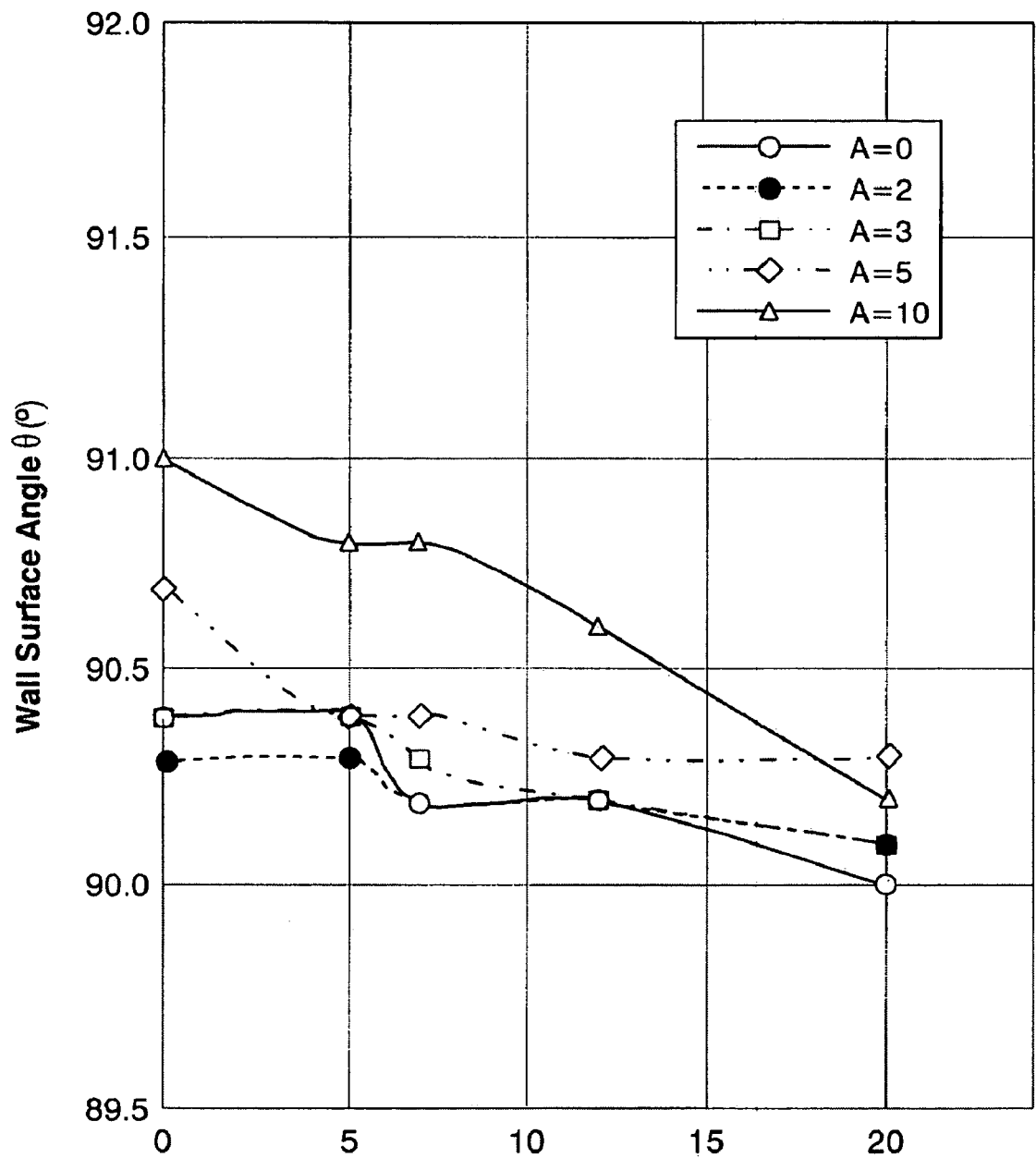
FIG. 15 is a graph showing the measurement results for angle $\theta$ in Experiment 2.

With the etching conditions described above, the etching speed, surface precision (roughness) ρ (nm) of hole wall surface 32, and angle θ (degrees) of wall surface 32 with respect to the groove bottom surface were measured. The results are shown in FIGS. 10 through 15. FIG. 10 is a table showing the measurement results for the etching speed (micrometers/min) under the etching conditions described above. FIG. 11 is a graph of the same. FIG. 12 is a table showing the measurement results for the surface precision (roughness) ρ (nm). FIG. 13 is a graph of the same. In addition, FIG. 14 is a table showing the measurement results for angle θ (degrees). FIG. 15 is a graph of the same.

In addition, in FIGS. 10, 12, and 14, flow rate $V_{e2}$ for $SF_6$ gas is expressed as a flow rate ratio with $C_4F_8$ gas flow rate $V_{d1}$ (60 ml/min) as 100. Similarly, flow rate $V_{d2}$ of $C_4F_8$ gas is expressed as a flow rate ratio with $SF_6$ gas flow rate $V_{e1}$ (200 ml/min) as 100.

Referring to FIGS. 10 through 15, in this experiment as well, when $SF_6$ gas was not used in step d (when A=0), the greater the flow rate $V_{d2}$ for $C_4F_8$ gas in step e, the better the surface precision (roughness) ρ (nm) and angle θ (degrees). However, etching speed was reduced. In addition, when $C_4F_8$ gas was not used in step e, increasing $SF_6$ gas flow rate $V_{e2}$ increased the etching speed. However, surface precision (roughness) ρ (nm) and angle θ (degrees) became poor. From these results, it can be seen that the right amounts for $SF_6$ gas flow rate $V_{e2}$ in step d and $C_4F_8$ flow rate $V_{d2}$ for step e could achieve good etching speed, surface precision (roughness) ρ (nm) and angle θ (degrees).

In the present experiment, as shown in FIGS. 10 through 15, when the flow rate ratio of $SF_6$ gas flow rate $V_{e2}$ with respect to $C_4F_8$ gas flow rate $V_{d1}$ was in the range of 2–5 and the flow rate ratio of $C_4F_8$ gas flow rate $V_{d2}$ with respect to $SF_6$ gas flow rate $V_{e1}$ was 5–12, the etching speed, surface precision (roughness) ρ (nm), and angle θ (degrees) were all judged to be good. With regard to the preferred ranges for etching speed, surface precision (roughness) ρ (nm), and angle θ (degrees), these are based on the same standards as in Experiment 1.

Compared with Experiment 1, in Experiment 2, the high frequency power $W_{o1}$ and $W_{o2}$ applied to coil 16 was lower, and high frequency power $W_{p1}$ and $W_{p2}$ applied to stage 3 was lower. In addition, $SF_6$ gas flow rate $V_{e1}$ and $C_4F_8$ gas flow rate $V_{d1}$ were also lowered accordingly. As can be seen from Experiments 1 and 2, regardless of the amount of high frequency power $W_{o1}$, $W_{o2}$ applied to coil 16 and high frequency power $W_{p1}$, $W_{p2}$ applied to stage 3, and regardless of the magnitude of $SF_6$ gas flow rate $V_{e1}$ and $C_4F_8$ gas flow rate $V_{d1}$, as long as the flow rate ratio of $SF_6$ gas flow rate $V_{e2}$ with respect to $C_4F_8$ gas flow rate $V_{d1}$ is in the range of 2–5, and the flow rate ratio of $C_4F_8$ gas flow rate $V_{d2}$ with respect to $SF_6$ gas flow rate $V_{e1}$ is in the range of 5–12, the etching speed, surface precision (roughness) ρ (nm), and angle θ (degrees) are all good.

USAGE IN INDUSTRY

As described above, the method for etching a silicon substrate and etching apparatus of the present invention is suitable for use in forming structural surfaces such as grooves or the like on a silicon substrate through a dry etching process.

What is claimed is:

1. A silicon-substrate etching method comprising:
    a mask-forming step of forming an etching mask on a silicon substrate surface;
    an etching step, carried out in sequence following said mask-forming step, of dry-etching the silicon substrate through openings in the etching mask to form on the silicon substrate predetermined structural features defining an etching ground, using $SF_6$ gas as an etching gas and a fluorocarbon gas as a protective-film-forming gas, in a mixture of 5 to 12 volume parts fluorocarbon gas to 100 volume parts $SF_6$ gas, to advance dry-etching mainly of the etching ground, with the gas mixture being converted into plasma by high-frequency power
    a film-forming step of using the $SF_6$ gas and the fluorocarbon gas, in a mixture of 2 to 5 volume parts $SF_6$ gas to 100 volume parts fluorocarbon gas, to form a protective film on surfaces, among the structural features, that are perpendicular with respect to the etching ground surface, with the gas mixture being converted into plasma by high-frequency power; wherein
    said etching step and protective-film-forming step are sequentially repeated while power is continually applied to the silicon substrate to put a biasing potential on the substrate.

2. A silicon-substrate etching method as recited in claim 1, wherein the high-frequency power for converting the gas mixture into plasma is made high during said etching step and low during said film-forming step.

3. A silicon-substrate etching method as recited in claim 1, wherein the power applied to said silicon substrate is made high during said etching step and is made low during said film-forming step.

4. A silicon-substrate etching method as recited in claim 3, wherein the high-frequency power for converting the gas mixture into plasma is made high during said etching step and low during said film-forming step.

* * * * *